United States Patent [19]
McClure

[11] Patent Number: 5,471,157
[45] Date of Patent: Nov. 28, 1995

[54] INTEGRATED CIRCUIT WITH CENTRALIZED CONTROL OF EDGE TRANSITION DETECTION PULSE GENERATION

[75] Inventor: David C. McClure, Denton, Tex.

[73] Assignee: SGS-Thomson Microelectronics, Inc., Carrollton, Tex.

[21] Appl. No.: 220,834

[22] Filed: Mar. 31, 1994

[51] Int. Cl.$^6$ .............................. H03K 19/00; H01L 25/00
[52] U.S. Cl. .................. 326/93; 365/230.08; 365/233.5; 326/101; 327/297
[58] Field of Search .............................. 327/24, 293, 296, 327/297; 326/93, 101; 365/230.08, 233.5, 189.05

[56] References Cited

U.S. PATENT DOCUMENTS

| | | | |
|---|---|---|---|
| 4,592,028 | 5/1986 | Konishi | 365/230 |
| 4,633,102 | 12/1986 | Childers | 326/93 |
| 4,636,991 | 1/1987 | Flannagan et al. | 365/233.5 |
| 4,893,282 | 1/1990 | Wada et al. | 365/233.5 |
| 4,922,122 | 5/1990 | Dubujet | 307/480 |
| 4,922,461 | 5/1990 | Hayakawa et al. | 365/230.08 |
| 5,003,513 | 3/1991 | Porter et al. | 365/230.08 |
| 5,073,872 | 12/1991 | Masuda et al. | 365/233.5 |
| 5,124,584 | 6/1992 | McClure | 307/480 |
| 5,264,737 | 11/1993 | Oikawa | 365/233.5 |
| 5,305,283 | 4/1994 | Shimokura et al. | 365/230.08 |
| 5,305,284 | 4/1994 | Iwase | 365/233.5 |
| 5,335,207 | 8/1994 | Takamoto | 365/233.5 |
| 5,374,894 | 12/1994 | Fong | 365/233.5 |

OTHER PUBLICATIONS

Okuyama et al., . "A 7.5–ns 32K×8 CMOS SRAM," *IEEE J. Solid State Circuits*, vol. 23, No. 5 (Oct. 1988), pp. 1054–1059.

Kohno et al., "A 14–ns 1–Mbit CMOS SRAM with Variable Bit Organization," *IEEE J. Solid State Circuits*, vol. 23, No. 5 (Oct. 1988), pp. 1060–1066.

Williams et al., "An Experimental 1–Mbit CMOS SRAM with Configurable Organization and Operation," *IEEE J. Solid State Circuits*, vol. 23, No. 5 (Oct. 1988), pp. 1085–1094.

*Primary Examiner*—Edward P. Westin
*Assistant Examiner*—Richard Roseen
*Attorney, Agent, or Firm*—Rodney M. Anderson; Lisa K. Jorgenson; Richard K. Robinson

[57] ABSTRACT

Circuitry for producing a transition detection signal of adequate and optimized duration is disclosed. A transition detection circuit is associated with each of the input terminals from which transitions are to initiate an operating cycle, such as precharge and equilibration in a memory access cycle. Each transition detection circuit produces, responsive to a logic transition at its associated terminal, a transition detection pulse. Those transition detection circuits which produce only brief transition detection pulses are coupled to a centralized summing circuit. The summing circuit generates the transition detection circuit from the logical combination of the transition detection circuits, and includes a delay circuit to lengthen the brief incoming transition detection pulse to the desired duration. In this way, a single placement of the summing circuit can be used to optimize the transition detection pulse duration for initiation of the operating cycle of the integrated circuit.

18 Claims, 6 Drawing Sheets

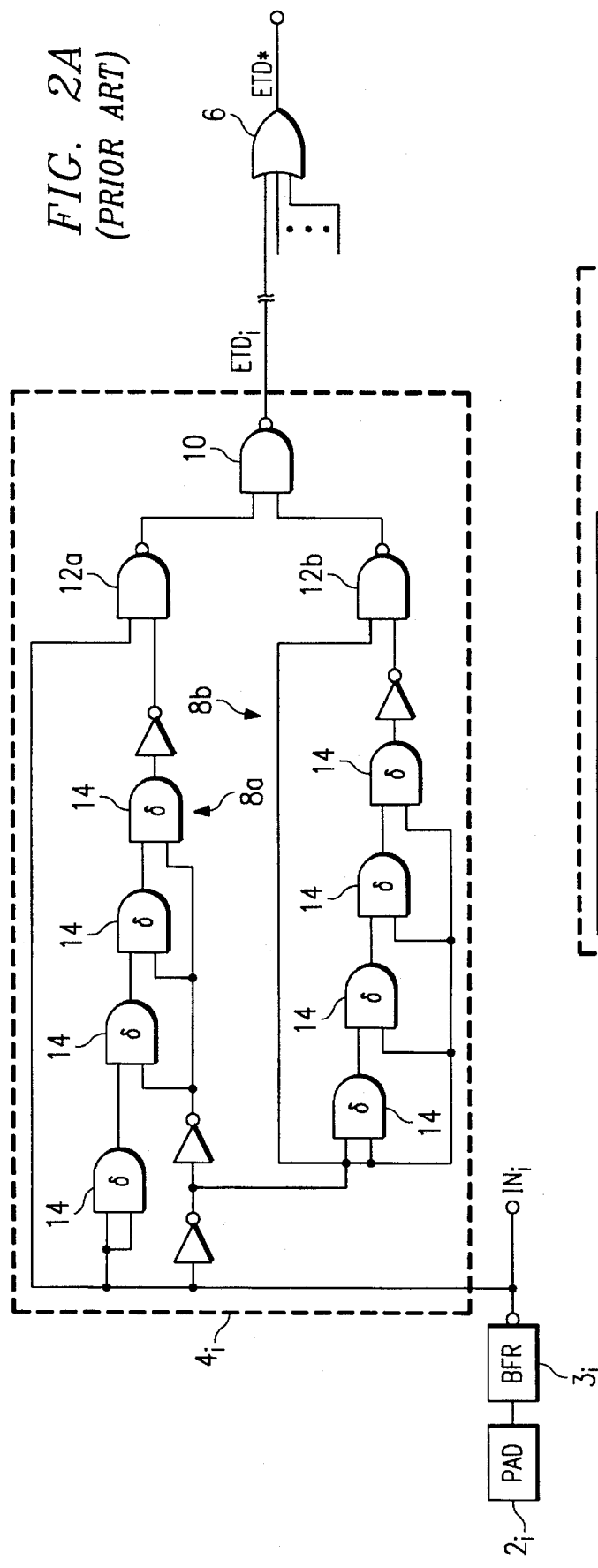
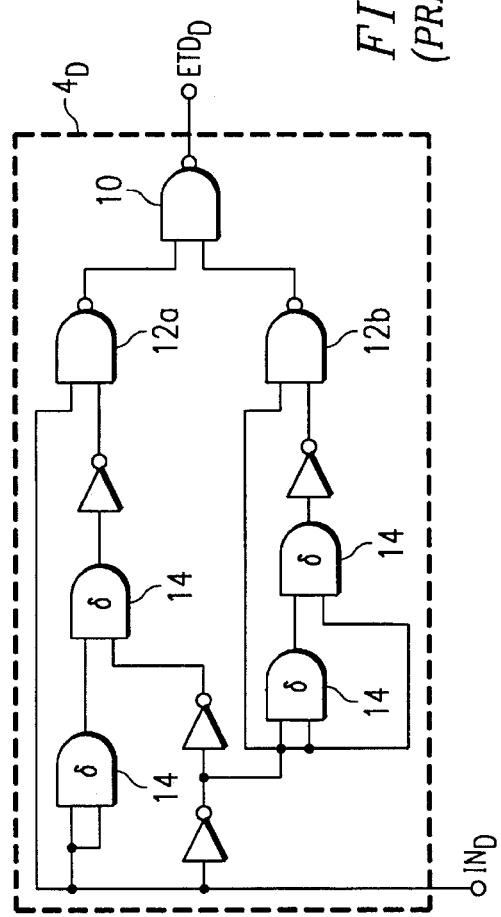
FIG. 2A (PRIOR ART)
FIG. 2B (PRIOR ART)
FIG. 2C (PRIOR ART)

INTEGRATED CIRCUIT WITH CENTRALIZED CONTROL OF EDGE TRANSITION DETECTION PULSE GENERATION

This invention is in the field of integrated circuits, and more specifically is in the field of timing control of such circuits.

BACKGROUND OF THE INVENTION

Many modern integrated circuits utilize the detection of transitions at their input terminals to initiate an operating cycle. One type of integrated circuit that especially benefits from this technique are static memories, including both static random-access memories (SRAMs) and also read-only memories (ROMs) of both the programmable and mask-programmed variety. As is known in the art, such memories may either be implemented as stand-alone integrated circuit memory chips, or embedded within microprocessor or other VLSI or ULSI logic devices. These conventional static memories are generally operated in an asynchronous fashion, with memory access initiated upon receipt of an address value and an enable signal, and without requiring a clock signal to be presented thereto. While many static memories are "fully" static, in that peripheral circuitry such as address decoders, sense amplifiers, and input/output circuitry are maintained as fully operational, modern static memories now utilize internal dynamic clocking for low power and fast access operation. Since these internally clocked static memories do not receive an external clock signal from which internal clock signals may be generated, the technique of edge transition detection (ETD) is useful in producing a timing pulse from which the internal clock signals can be generated. Examples of memories including ETD (also referred to as "address transition detection" or "ATD") are described in Okuyama et al., "A 7.5-ns 32K×8 CMOS SRAM," *IEEE J. Solid State Circuits*, Vol. 23, No. 5 (October 1988), pp. 1054–1059, Kohno et al., "A 14-ns 1-Mbit CMOS SRAM with Variable Bit Organization," *IEEE J. Solid State Circuits*, Vol. 23, No. 5 (October 1988), pp. 1060–1066, and Williams et al., "An Experimental 1-Mbit CMOS SRAM with Configurable Organization and Operation", *IEEE J Solid State Circuits*, Vol. 23, No. 5 (October 1988), pp. 1085–1094, all incorporated herein by this reference. An example of the use of ETD in input buffers, and an example of an ETD circuit, are described in my U.S. Pat. No. 5,124,584, assigned to SGS-Thomson Microelectronics, Inc., and also incorporated herein by this reference.

Those in the art will appreciate that the generation of internal clock signals from edge transition detection makes the ETD pulse a critical timing parameter in static memories. On one hand, the ETD pulse must remain active long enough to be communicated to clocked circuits distributed around the chip, so as to successfully accomplish precharge and equilibration functions. On the other hand, the duration of the ETD pulse should not be maintained so long as to delay access.

Referring now to FIG. 1, an exemplary conventional integrated circuit memory chip 1 is illustrated in plan view, showing an example of the layout location of input pads 2 and their edge transition detection (ETD) circuits 4. As is known in the art, the number of inputs that are to be monitored for edge transition can be substantial in modern SRAMs, as high as fifty or greater in modern memories (i.e., twenty or more addresses, thirty-two or more data input terminals, and associated control signal inputs). The number of such input pads 2 and ETD circuits 4 shown in FIG. 1 is much reduced from this, for purposes of clarity of description. In addition, pads other than input pads 2 are also present in integrated circuit 1 that will either not be subject to transition (e.g., power supply and ground pads) or are not to be monitored for this purpose (e.g., dedicated output pads).

According to this example, each input pad 2 is associated with an ETD circuit 4, which detects transitions at input pad 2 and generates a pulsed signal responsive thereto. Conventionally, as shown in FIG. 1, ETD circuits 4 are located on the chip near their associated input pad 2. Since the integrated circuit generates its internal clock signals for a memory cycle responsive to the detection of a transition at any one of the input pads 2, the output of each ETD circuit 4 is bussed to a summing circuit 6 (schematically illustrated as an OR function in FIG. 1), which generates a signal ETD, from which the internal clock signals for an operating cycle of circuit 1 may be generated. Alternatively, some or all of the outputs of ETD circuits 4 may be combined in a wired-OR arrangement.

Referring now to FIG. 2a, ETD circuit $4_i$ associated with an input pad $2_i$ and according to a conventional design is illustrated and will now be described; of course, other types and designs of ETD circuits are also used in conventional circuit 1. The signal at input pad $2_i$, after buffering by inverting input buffer $3_i$, is communicated to ETD circuit $4_i$ as well as to the remainder of integrated circuit 1 (at node $IN_i$). As described in the above-incorporated U.S. Pat. No. 5,124,584, ETD circuit 4 includes two legs 8a, 8b, each leg terminating at a corresponding NAND gate 12a, 12b. The outputs of NAND gates 12a and 12b are connected to inputs of NAND gate 10, the output of which drives line $ETD_i$. Line $ETD_i$ is communicated to summing circuit 6 as shown in FIG. 1. In addition, as described in the above-incorporated U.S. Pat. No. 5,124,584, line $ETD_i$ may be used to control the latching of the input signal on node $IN_i$ for protection against spurious input pulses.

First leg 8a and second leg 8b of ETD circuit $4_i$ each include a series of delay stages 14 implemented in the form of AND functions; for example, as shown in FIG. 2b, each of delay stages 14 may be implemented as NAND gate 14a with its inputs connected to one another, followed by inverter 14b. In first leg 8a, node $IN_i$ is connected directly to one input of NAND gate 12a, and to both inputs of the first delay stage 14 in first leg 8a; the second input of NAND gate 12a receives the inverted output from the last delay stage 14 in first leg 8a. Similarly, in second leg 8b, the inverted state of node $IN_i$ is presented to a first input of NAND gate 12b and to both inputs of the first delay stage in leg 8b; the other input of NAND gate 12b receives the inverted output of the last delay stage 14 in second leg. As such, first and second legs 8a, 8b are substantially identical, except that complementary states are provided to their inputs.

In operation, ETD circuit $4_i$ generates a high logic level pulse at the output of NAND gate 10, at line $ETD_i$ responsive to the receipt of a logic transition at input pad $2_i$. For example, if input pad $2_i$ is initially high and node $IN_i$ is initially low, the output of NAND gates 12a and 12b will both be high, causing a low logic level to be driven by NAND gate 10 at line $ETD_i$. Upon a high-to-low transition at input pad $2_i$ resulting in a low-to-high transition of node $IN_i$, a high level is presented to one input of NAND gate 12a (the other input already having a high logic level thereat), causing NAND gate 12a to change state and present a low logic level to NAND gate 10 in combination with the high level previously driven by NAND gate 12b (which does not change due to this transition). This causes line $ETD_i$ to go to a high logic level until such time as the high level at node $IN_i$ propagates through delay stages 14 in first leg 8a to the second input of NAND gate 12a (as a low logic level), causing the output of NAND gate 12a to return high to force a low logic level at node $ETD_i$. Second leg 8b operates in a similar fashion to generate the pulse at line $ETD_i$ responsive to a low-to-high transition at pad $2_i$.

As a result of the construction of ETD circuit $4_i$, the duration of the pulse at line $ETD_i$ is determined by the delay period through the delay stages 14 in first and second legs 8a, 8b (depending upon the polarity of the input transition), and thus by the number of delay stages 14 in each of first and second legs 8a, 8b. For example, FIG. 2c illustrates the construction of ETD circuit $4_D$, in which the first and second legs 8a, 8b, respectively, have only two delay stages 14. As a result, the width of the pulse produced by ETD circuit $4_D$ at line $ETD_D$, responsive to a transition at input node $IN_D$, is shorter than that produced at line $ETD_i$ of FIG. 2a. By way of further background, ETD circuit $4_D$ conventionally is used in connection with data input transition detection, in contrast with ETD circuit $4_i$ being conventionally used in connection with address input transition detection.

As noted above, the duration of the edge transition detection pulse is a critical parameter in modern integrated circuits. However, in many high-speed integrated circuit designs, the design and selection of the proper ETD pulse width cannot be optimized until actual circuits are built and functionally tested under all voltage and temperature conditions. Specifically, it has been found in some first-revision circuits that the ETD pulse may be too short in some conditions, necessitating a design change to lengthen the ETD pulse. As is evident from FIGS. 2a and 2c, lengthening of the ETD pulse would be effected by the adding more delay stages 14 into each of the first and second legs 8a, 8b of each of the ETD circuits $4_i$, $4_D$ in integrated circuit 1. The provision of additional delay stages into each of the ETD circuits $4_i$, $4_D$ is quite inefficient from a layout standpoint, given that the additional elements must be provided for each one of the ETD circuits $4_i$, $4_D$. Furthermore, layout constraints may actually prevent the addition of delay stages 14, as has been particularly observed for input data ETD circuits $4_D$ at those locations that lack the chip surface area for additional gates, for example as due to the space required for output buffer and driver circuitry thereat. In addition, the characterization of the effects of varying ETD pulse durations, using conventional techniques such as focused ion beam or special test modes, is made cumbersome by the multiple placements of ETD circuits 4.

It is therefore an object of the present invention to provide an edge transition detection circuit that provides efficient optimization of the duration of the edge transition detection pulse.

It is a further object of the present invention to provide such a circuit with centralized delay stage placement, thus achieving improvements in chip layout efficiency.

It is a further object of the present invention to provide such a circuit which enables individual ETD circuits associated with inputs to be implemented in minimal chip area.

It is a further object of the present invention to provide delay stages that allow for lengthening of the pulse duration by more than 100% of the input pulse duration.

Other objects and advantages of the present invention will be apparent to those of ordinary skill in the art having reference to the following specification together with its drawings.

SUMMARY OF THE INVENTION

The invention may be implemented into an integrated circuit having a plurality of edge transition detection circuits, each associated with an input terminal. The output of each of the edge transition detection circuits are forwarded to a summing circuit which generates a global edge transition signal responsive to any one of the plurality of edge transition detection circuits indicating receipt of a transition at its associated input terminal. The summing circuit includes a delay circuit so that the output of the summing circuit has a duration that is substantially longer than that generated by the edge transition detection circuits.

BRIEF DESCRIPTION OF THE DRAWINGS

FIG. 2a is an electrical diagram, in schematic form, of an edge transition detection circuit according to the prior art.

FIG. 2b is an electrical diagram, in schematic form, of a delay stage as used in the conventional circuit of FIG. 2a.

FIG. 2c is an electrical diagram, in schematic form, of an edge transition detection circuit according to the prior art, and which produces a shorter pulse than that of FIG. 2a.

DETAILED DESCRIPTION OF THE PREFERRED EMBODIMENTS

Figure 1:
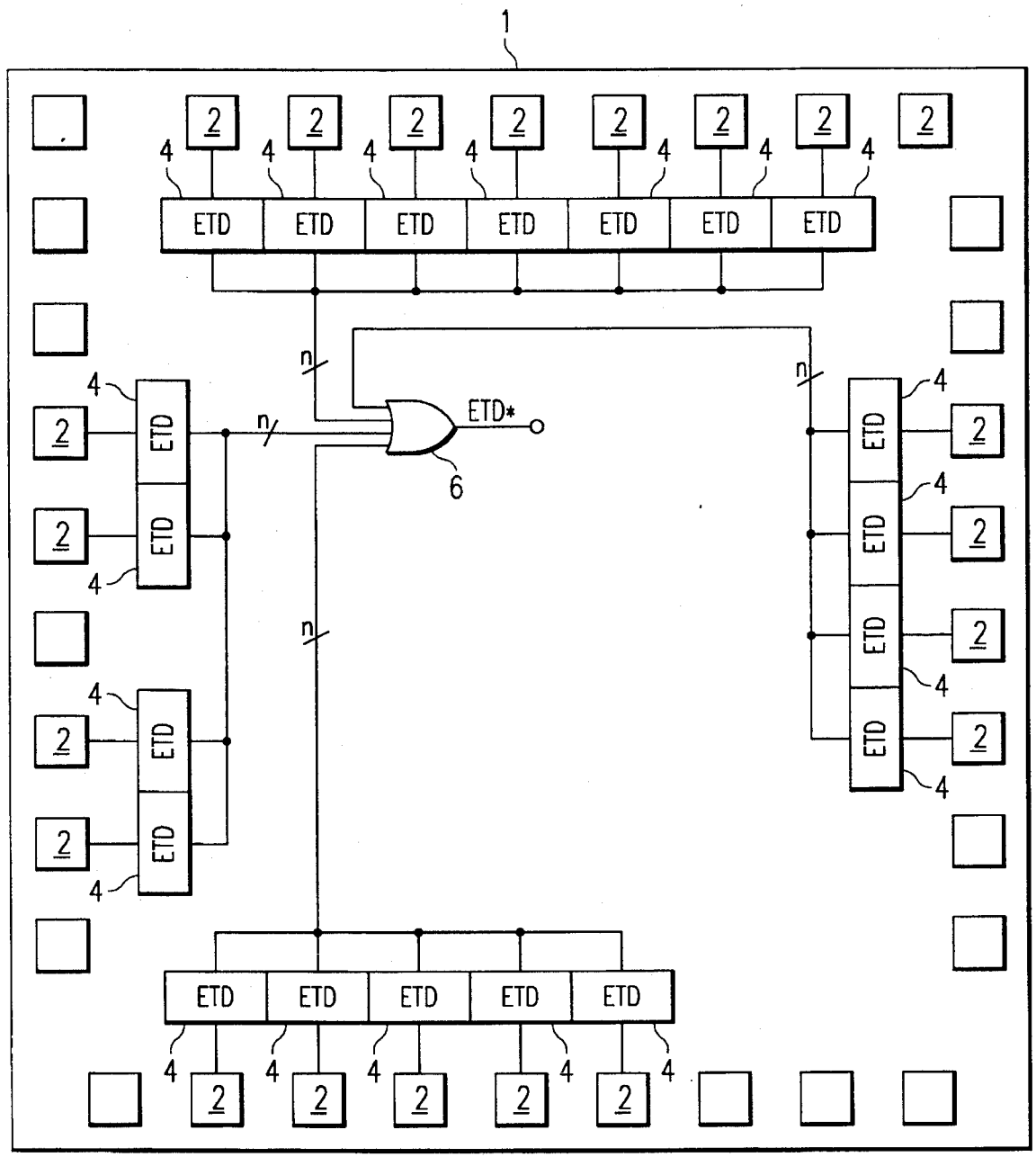
FIG. 1 is a plan view of a conventional integrated circuit illustrating the relative positions of edge transition detection circuits together with a summing circuit.
Figure 3:
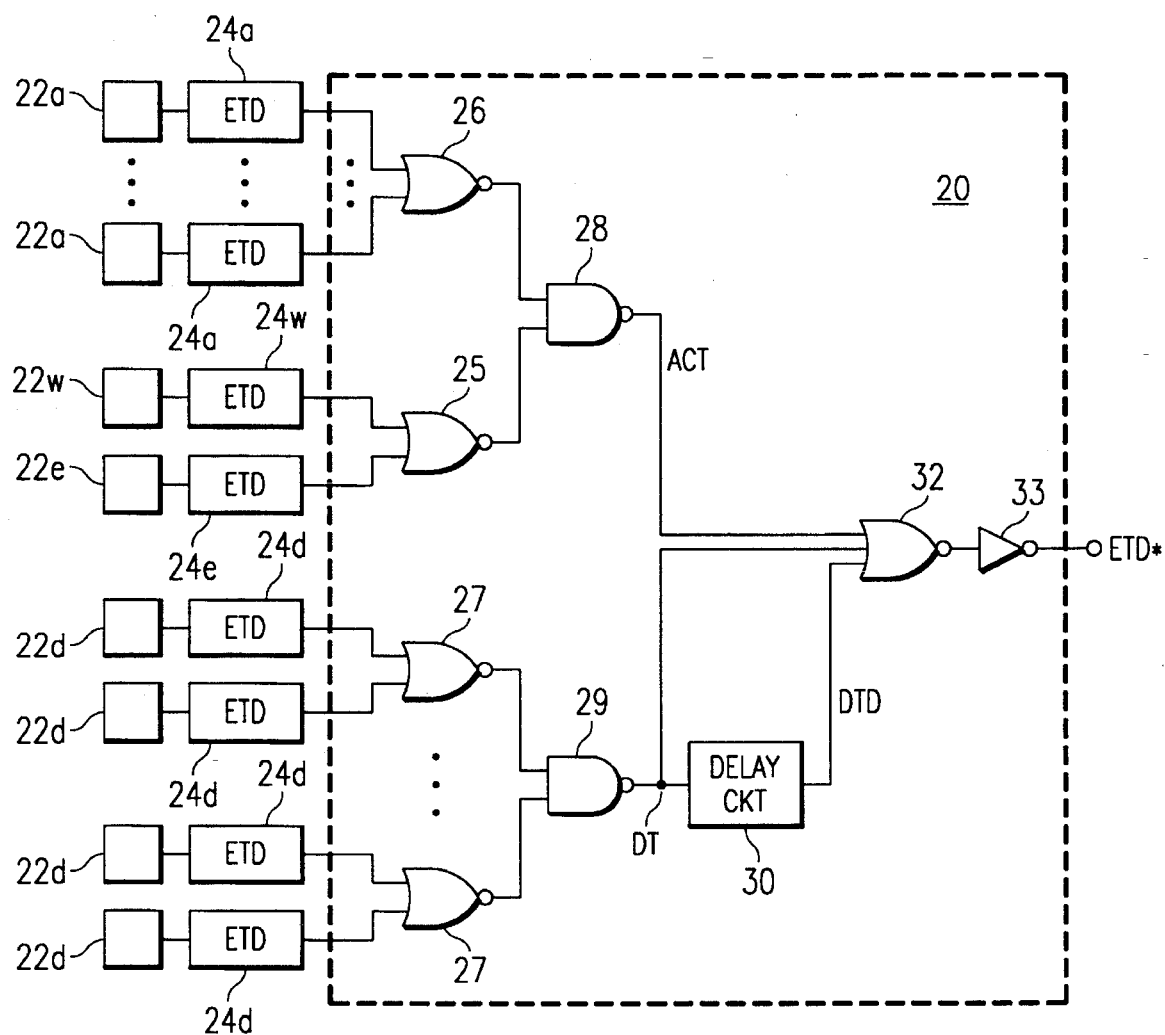
FIG. 3 is an electrical diagram, in schematic and block form, of an edge transition and summing circuit according to the preferred embodiment of the invention.

Referring now to FIG. 3, edge transition detection circuitry according to the preferred embodiment of the invention will now be described in detail. As shown schematically in FIG. 3, a number of input terminals or pads 22a, for receiving address signals, are each connected to an associated address ETD circuit 24a. Write enable terminal 22w and chip enable terminal 22e are similarly connected to control signal ETD circuits 24w, 24e, respectively; in this way, edge transitions at these control terminals can also initiate an operating cycle according to the present invention. According to this example of the preferred embodiment of the invention, ETD circuits 24a, 24w, 24e are each constructed similarly as ETD circuit $4_i$ described above relative to FIG. 2a.

Similarly, input data terminals or pads 22d each receive input data, and are connected to an associated ETD circuit 24d that is constructed similarly as ETD circuit $4_D$ described above relative to FIG. 2c. Accordingly, in this example of the preferred embodiment of the invention, the duration of the ETD pulse generated by address ETD circuits 24a, in the event of a transition at an address terminal 22a, is longer than that of the pulse generated by input data ETD circuits 24d responsive to a transition at a data input terminal 22d. For example, the duration of the pulse generated by address ETD circuits 24a and control signal ETD circuits 24w, 24e may be on the order of 8 to 10 nsec, while the duration of the pulse generated by input data ETD circuits 24d may be on the order of 3 to 4 nsec.

Figure 4:
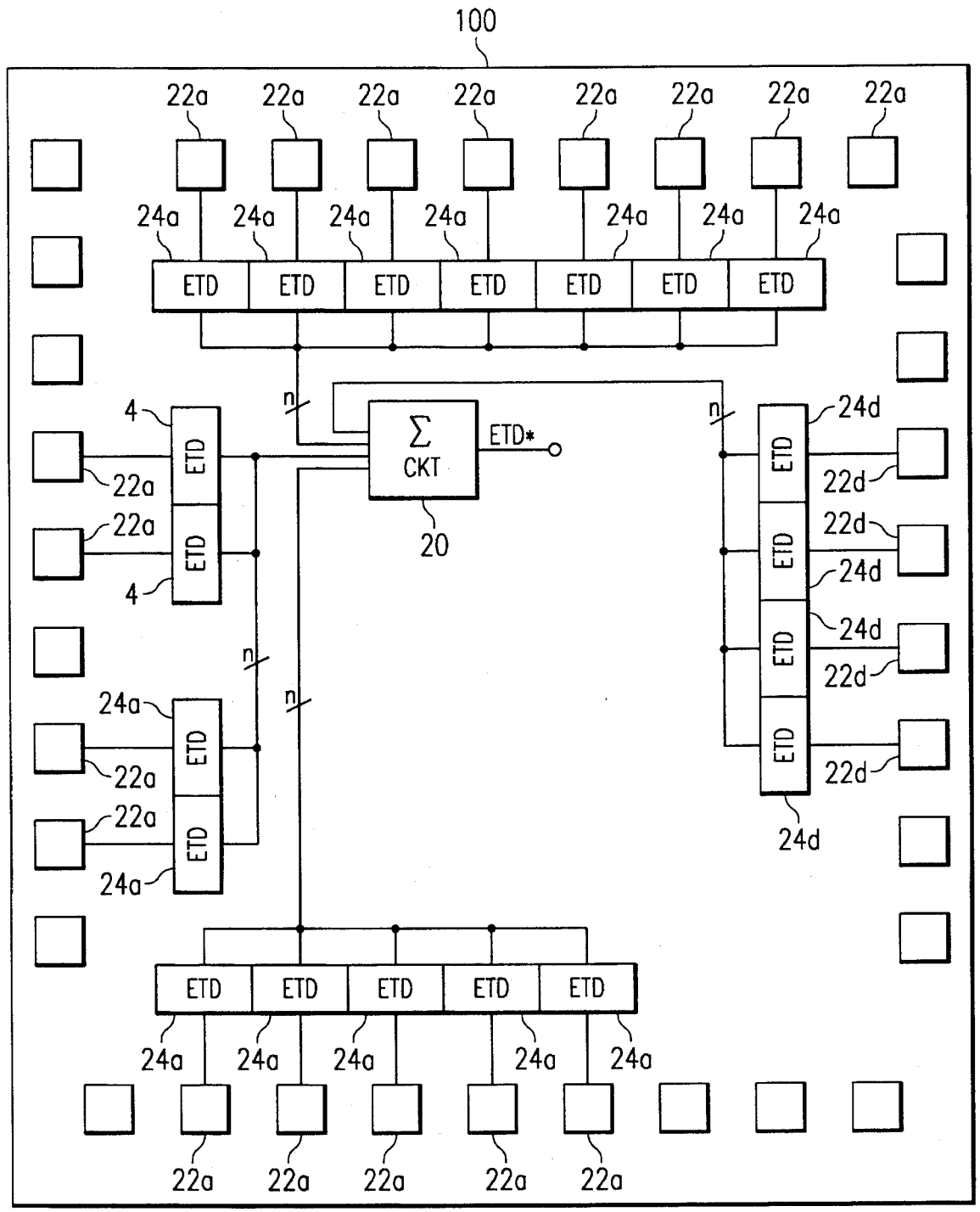
FIG. 4 is a plan view of an integrated circuit according to the preferred embodiment of the invention, illustrating the relative positions of the edge transition detection circuits together and the summing circuit of FIG. 3.

According to the preferred embodiment of the invention, the outputs of each of the ETD circuits 24a, 24d, 24w, 24e are communicated to summing circuit 20, despite the difference in the duration of the produced ETD pulses. For the example of integrated circuit 100 shown in FIG. 4, summing circuit 20 has a single placement and receives signals from ETD circuits 24 located across and around integrated circuit 100. The output of summing circuit 20, on line ETD*, is a pulse indicating that a transition at one of the input terminals (address, control or input data) has been detected, and that an operating cycle of the integrated circuit 100 is to be initiated. In addition, as noted above, the pulse on line ETD* is also used as a basis for the generation of internal clock signals for the initiated operating cycle, and for effecting precharge and equilibration in memory integrated circuits. As will become apparent from the following description, summing circuit 20 lengthens the duration of the ETD pulses produced by input data ETD circuits 24d, by way of a single placement of additional delay elements, for consistency with ETD pulses produced by address ETD circuits 24a and control signal ETD circuits 24w, 24e.

Summing circuit 20 includes NOR function 25 which receives, at its inputs, the outputs of write enable ETD circuit 24w and chip enable ETD circuit 24e. Inputs to NOR function 26 in summing circuit 26 receive the outputs of each address ETD circuit 24a. NOR functions 25, 26 may each be implemented as the combination of multiple NOR functions, or alternatively may be implemented in wired-NOR fashion. The outputs of NOR functions 25, 26 are connected to corresponding inputs of NAND function 28, which drives line ACT at its output. Line ACT thus presents an active high pulse responsive to any one of address ETD circuits 24a or control ETD circuits 24w, 24e presenting an active high pulse upon a transition at its associated input terminal 22a, 22w, 22e, respectively.

Summing circuit 20 also includes NOR functions 27 for processing of the input data ETD pulses. The output of each input data ETD circuit 24d is connected to a corresponding input of one of NOR functions 27. Summing circuit 20 preferably includes multiple NOR functions 27, such that the outputs of input data ETD circuits 24d are arranged in groups. Each of NOR functions 27 presents its output to NAND function 29, which drives line DT at its output. Line DT thus presents an active high pulse responsive to any one of input data ETD circuits 24d presenting an active high pulse upon a transition at its associated input data terminal 22d.

Line ACT at the output of NAND function 28, and line DT at the output of NAND function 29, are each connected to respective inputs of NOR function 32 in summing circuit 32. Line DT is also connected to delay circuit 30, which presents a delayed signal on line DTD to a third input of NOR function 32. According to the preferred embodiment of the invention, delay circuit 30 lengthens the duration of the pulse generated by input data ETD circuits 24d, as will be described hereinbelow. NOR function 32 drives line ETD*, after inversion by inverter 33, to present a pulse corresponding to the logical OR of lines ACT, DT and DTD. The pulse on line ETD* is used to initiate an operating cycle in circuit 100 responsive to the detection of a transition at any of address terminals 22a, control terminals 22w, 22e, and input data terminals 22d. In this example, the pulse on line ETD* is an active high pulse, since the pulses on lines ACT, DT, DTD are all active high pulses.

Delay circuit 30 may be implemented by way of any conventional delay elements, such as one or more logic stages in sequence. However, certain circuit arrangements have been found to be preferable for lengthening the duration of the ETD pulses by a large amount, and will now be described in detail.

Figure 5:
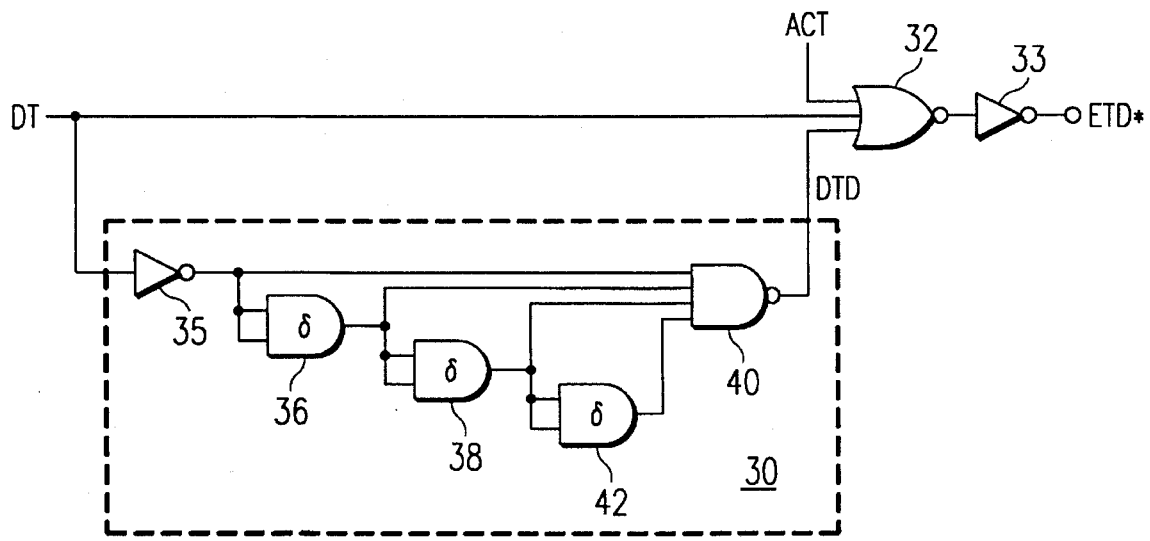
FIG. 5 is an electrical diagram, in schematic form, of a delay stage in the summing circuit according to the preferred embodiment of the invention.

Referring now to FIG. 5, the construction of delay circuit 30 for presenting a pulse on line DTD that is longer in duration than that on line DT, according to a first embodiment of the invention, will be described in detail. Delay circuit 30 includes NAND function 40 that receives, at a first input, the state of line DT inverted by inverter 35. The output of inverter 35 is also connected to both inputs of delay stage 36. In this example, delay stages 36, 38, 40 are constructed similarly as described hereinabove relative to FIG. 2b, and thus correspond to a logical AND function having a propagation delay. Of course, the number of delay stages in delay circuit 30 may vary from one to many, depending upon the desired pulse width. The output of delay stage 36 is connected to a second input of NAND function 40, and to both inputs of the succeeding delay stage 38. Similarly, the output of delay stage 38 is connected to another input of NAND function 40 and to both inputs of delay stage 42; the output of delay stage 42 is connected to an input of NAND function 40.

Figure 6:
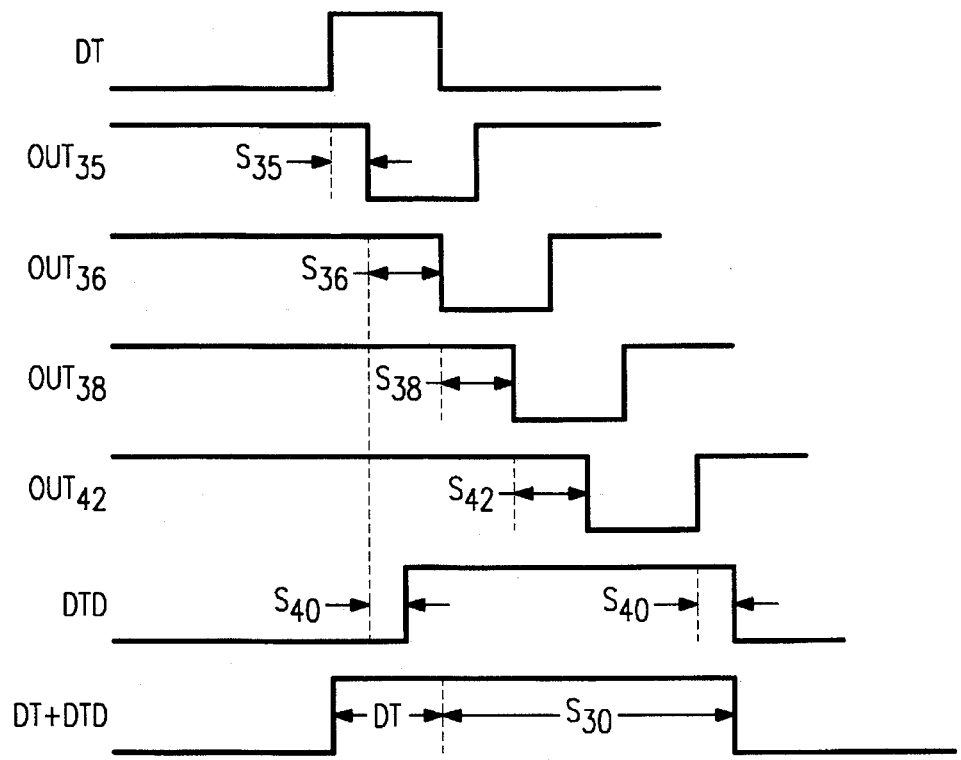
FIG. 6 is a timing diagram illustrating the operation of the circuit of FIG. 5.

This construction of delay circuit 30 thus produces a pulse on line DTD having a duration defined by the duration of the pulse at line DT and the propagation delay through delay stages 36, 38, 42. Referring now to FIG. 6, the operation of delay circuit 30 will now be described in detail. Prior to detection of an input transition (i.e., in steady-state), line DT is at a low logic level. The output of inverter 35 (shown in FIG. 6 as $OUT_{35}$) is thus at a high logic level, causing the outputs of delay stages 36, 38, 42 (shown in FIG. 6 as lines $OUT_{36}$, $OUT_{38}$, $OUT_{42}$, respectively) to also be high. With all four inputs to NAND function 40 high, line DTD is driven low. In this condition, referring back to FIG. 3, with all three lines ACT, DT, DTD at a low logic level, line ETD* also remains at a low logic level.

Referring back to FIG. 3, upon detection of a transition at an input data terminal 22d, the associated input data ETD circuit 24d will generate an active high pulse at its output, of a duration defined by the delay of ETD circuit 24d. This active high pulse is communicated to summing circuit 20, and applied to an input of NOR function 27 which, in turn, presents a low logic level to NAND function 29. As a result, an active high pulse is presented on line DT which has a duration corresponding to the propagation delay of the input data ETD circuit 24d that detected the transition. As noted above, due to layout and design limitations, this pulse duration may not be adequate for generation of internal clock signals and other signals, such as precharge and equilibration, that are necessary for integrated circuit 100 to initiate and perform an operating cycle.

Referring back to FIG. 6, the active high pulse on line DT causes a low logic level to be driven by inverter 35 on line $OUT_{35}$, delayed by the propagation delay $\delta_{35}$ of inverter 35.

This low logic level is presented to an input of NAND function 50, producing a high logic level on line DTD after the propagation delay $\delta_{40}$ of NAND function 40. For proper operation of summing circuit 30, the pulse on line DTD must overlap the pulse on line DT, such that the resulting pulse on line ETD* is a single, longer, pulse than the pulse on line DT. Accordingly, the sum of propagation delays $\delta_{35}$ and $\delta_{40}$ must be less than the duration of the pulse on line DT.

Also responsive to the low level pulse at the output of inverter 35, delay stage 36 produces a low logic level at its output (OUT$_{36}$), delayed by the propagation delay $\delta_{36}$. This low logic level at the output of delay stage 36 is presented to NAND function 40, maintaining line DTD high after such time as line DT returns high and after the output of inverter 35 returns high. In order to maintain a single extended high logic level at line DTD, it is therefore important that the delay time $\delta_{36}$ be shorter than the duration of the pulse on line DT, so that the low logic level at the output of delay stage 36 overlaps the low logic level at the output of inverter 35.

The low logic level pulse originating at the output of inverter 35 propagates in similar fashion through delay stages 38 and 42. As shown in FIG. 6, the output of delay stage 38 (OUT$_{38}$) goes low responsive to the falling edge of OUT$_{36}$, delayed by propagation delay $\delta_{38}$ of delay stage 38; similarly, the output of delay stage 42 (OUT$_{42}$) is driven low responsive to the falling edge of OUT$_{38}$, delayed by propagation delay $\delta_{42}$ of delay stage 42. Each low level output OUT$_{38}$, OUT$_{42}$ is forwarded to NAND function 40 so as to overlap the previously generated low logic level, and maintaining line DTD high. In each case, it is important that none of the propagation delays $\delta_{38}$, $\delta_{42}$ exceed the duration of the pulse at line DT to ensure that the output at line DTD does not prematurely return to a low logic level. The pulse on line DTD returns low responsive to output OUT$_{42}$ returning high, which occurs as the high-to-low transition of line DT propagates through delay circuit 30 to appear (as a low-to-high transition) at the output of delay stage 42, and propagates through NAND function 40.

As illustrated in FIG. 6, the logical OR of lines DT and DTD (and thus the active high pulse on line ETD*) has a duration that is the sum of the pulse duration on line DT and the propagation delay $\delta_{30}$ through delay circuit 30. The propagation delay $\delta_{30}$ is the sum of the propagation delays $\delta_{35}$, $\delta_{36}$, $\delta_{38}$, $\delta_{42}$ and $\delta_{40}$. For example, typical propagation delays for inverter 35 and NAND function 40 according to conventional technology are on the order of 1 nsec, while typical propagation delays for delay stages 36, 38, 42 are on the order of 2 nsec. For a 3 nsec active high pulse on line DT generated by an input data ETD circuit 24d, summing circuit 20 according to this embodiment of the invention would produce an active high signal on line ETD* of 11 nsec (i.e., 3 nsec plus 8 nsec). Summing circuit 20 is thus able to lengthen the duration of the ETD signal pulse by the provision of a centrally located single placement of delay circuit 30, and thus in a manner that avoids having to replicate delay stages for each input terminal, and that allows for full chip area utilization at the critical locations near input terminal pads. This centralized placement of delay circuit 30 also greatly facilitates the adjustment of the ETD pulse duration by way of conventional techniques such as mask revision, focused ion beam, fuse programming, and special test mode operation.

According to this embodiment of the invention, the duration of the transition detection pulses produced by address ETD circuits 24a and control signal ETD circuits 24w, 24e is on the order of 10 nsec, and as such summing circuit 20 is not required to provide lengthening thereof. Of course, in the alternative, one may remove delay stages from address ETD circuits 24a and control signal ETD circuits 24w, 24e so that their pulses are similarly as short as those produced by input data ETD circuits 24d, and forward the logical combination at the output of NAND function 28 on line ACT to delay circuit 30 (or to its own delay circuit), for pulse lengthening in similar manner as described above.

Figure 7:
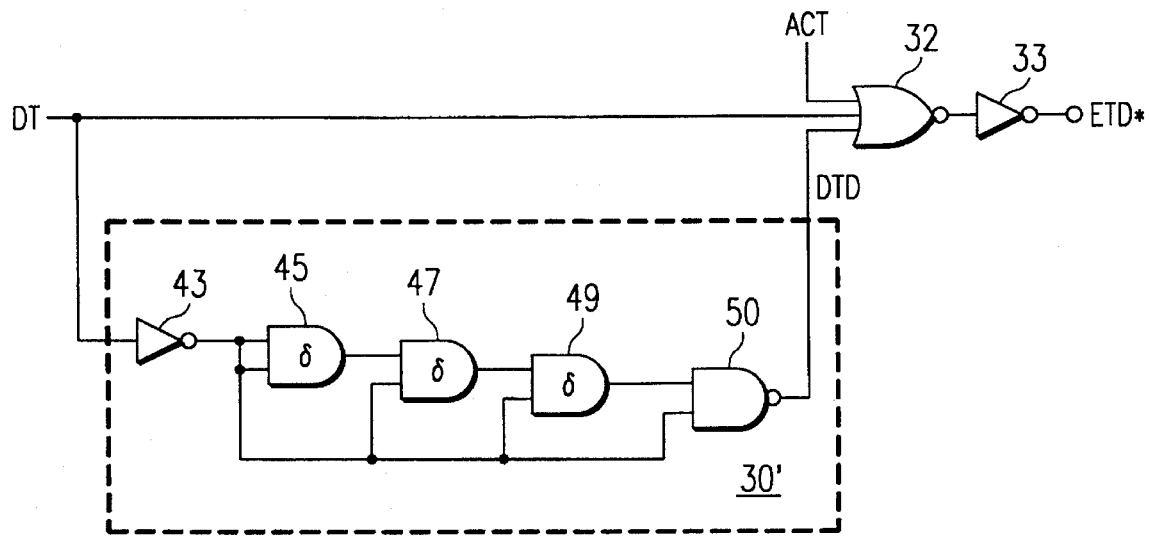
FIG. 7 is an electrical diagram, in schematic form, of a delay stage in the summing circuit according to an alternative embodiment of the invention.

Referring now to FIG. 7, delay circuit 30' according to a second embodiment of the invention will now be described in detail. Delay circuit 30' can be substituted for delay circuit 30 of FIG. 5 in summing circuit 20 shown in FIG. 3. Lines DT and ACT are connected to inputs of NOR function 32 for driving line ETD* via inverter 33, as before. Line DT is also connected to inverter 43 which in turn drives both inputs of AND delay stage 45, as well as one input of each of AND delay stages 47, 49 and NAND function 50. AND delay stages 45, 47, 49 correspond to logical AND functions, and may be constructed as a NAND followed by an inverter as described hereinabove relative to FIG. 2b. The output of AND delay stage 45 is connected to the second input of AND delay stage 47, while the output of AND delay stage 47 is connected to the second input of AND delay stage 49. The output of AND delay stage 49 is connected to the second input of NAND function 50, which drives line DTD at its output. Line DTD is connected to an input of NOR function 32, as before.

The operation of delay stage 30' will now be described in detail relative to FIG. 8. As in the case of delay stage 30 described hereinabove, line DT is at a low logic level in the steady-state condition of summing circuit 20, prior to detection of a transition at an input data terminal 22d. This forces high logic levels at the outputs of inverter 43 and AND delay stages 45, 47, 49 (i.e., OUT$_{43}$, OUT$_{45}$, OUT$_{47}$, OUT$_{49}$, respectively). As a result, both inputs to NAND function 50 are high and thus line DTD is at a low logic level.

As described hereinabove relative to FIGS. 3 and 5, upon detection of an edge transition at one of input data terminals 22d, the associated input data ETD circuit 24d communicates an active high pulse, of relatively short duration, to the input of NOR function 27 in summing circuit 20. By operation of NAND function 29, line DT then presents an active high pulse to NOR function 32 (initiating a high logic level on line ETD*) and to inverter 43. The output of inverter 43 (OUT$_{43}$) makes a high-to-low transition responsive to the leading edge of the active high pulse on line DT, delayed by propagation delay $\delta_{43}$. This low level at the output of inverter 43 is presented to NAND function 50, which in turn drives line DTD high after the propagation delay $\delta_{50}$ of NAND function 50. The low level at the output of inverter 43 is also presented to one input of each of AND delay stages 45, 47, 49, causing their outputs to go low after their respective propagation delays $\delta_{45}$, $\delta_{47}$, $\delta_{49}$.

At the end of the active high pulse on line DT and after the propagation delay $\delta_{43}$, the output of inverter 43 (OUT$_{43}$) returns high. As shown in FIG. 8, however, at this time, each of AND delay stages 45, 47, 49 maintains its output at a low logic levels. The output of AND delay stage 45 (OUT$_{45}$) remains low until the high logic level at OUT$_{43}$ has propagated through AND delay stage 45, at which time its output (OUT$_{45}$) returns high. To ensure that a single pulse at line DTD is generated, it is important that each of the propagation delays $\delta_{45}$, $\delta_{47}$, $\delta_{49}$ of AND delay stages 45, 47, 49 be shorter than the duration of the pulse at line DT, so that the outputs of AND delay stages 45, 47, 49 are all driven low prior to the output of inverter 43 (OUT$_{43}$) returning to a high logic level.

The high logic level returning at the output of AND delay stage 45 (OUT$_{45}$) is in turn presented to AND delay stage 47 which, after propagation delay $\delta_{47}$, drives a high logic level at its output (OUT$_{47}$). The high logic level of OUT$_{47}$ then propagates through AND delay stage 49, appearing at its output (OUT$_{49}$) after the propagation delay $\delta_{49}$, at which time NAND function 50 has high logic levels at both of its inputs. Line DTD then returns to a low logic level after propagation delay $\delta_{50}$ through NAND function 50.

Figure 8:
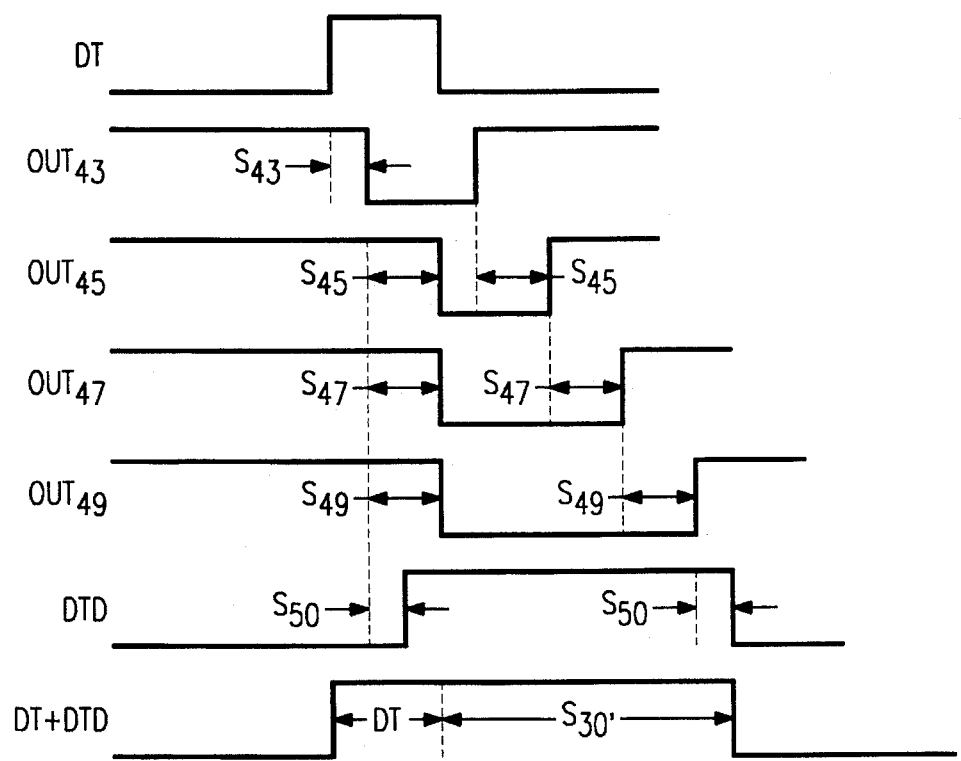
FIG. 8 is a timing diagram illustrating the operation of the circuit of FIG. 7.

As illustrated in FIG. 8, and similarly as discussed above relative to delay circuit 30, the logical OR of lines DT and DTD (and thus the active high pulse on line ETD*) has a duration that is the sum of the pulse duration on line DT and the propagation delay $\delta_{30'}$ through delay circuit 30'. The propagation delay $\delta_{30'}$ is the sum of the propagation delays $\delta_{43}$, $\delta_{45}$, $\delta_{47}$, $\delta_{49}$ and $\delta_{50}$. For example, for propagation delays for inverter 43 and NAND function 50 are on the order of 1 nsec and propagation delays for AND delay stages 45, 47, 49 are on the order of 2 nsec, summing circuit 20 according to this embodiment of the invention would produce an active high signal on line ETD* of 11 nsec in duration on receipt of an active high pulse on line DT of 3 nsec in duration. Similarly as noted above, delay circuit 30' in summing circuit 20 lengthens the duration of the ETD signal pulse without requiring replication of delay stages for each input terminal. Layout and design efficiency, particularly at locations near input terminal pads, as well as ease of pulse duration adjustment, are thus improved.

Of course, delay circuit 30 may be constructed according to other implementations. Care must be taken, however, when the incoming pulses are less than 50% of the duration of the desired lengthened pulse, to ensure that a single lengthened pulse is produced rather than merely a second delayed pulse of the same duration. The preferred embodiments of delay circuits 30, 30' described hereinabove are effective for lengthening the transition detection pulses well beyond 100% of the duration of the incoming pulse, as noted in the above description.

The preferred embodiment of the invention described hereinabove contemplates that the duration of the ETD pulse from address ETD circuits 24a and control signal ETD circuits 24w, 24e is adequate, and thus no lengthening is provided therefor in summing circuit 20. Of course, it will be appreciated that some or all of the outputs of address ETD circuits 24l and control signal ETD circuits 24w, 24e may also be forwarded to delay circuit 30 or 30', if shorter ETD pulses are produced thereby This would provide additional layout and design efficiency, as the number of delay elements in address ETD circuits 24l and control signal ETD circuits 24w, 24e could be reduced.

Further in the alternative, summing circuit 20 may be implemented to have a larger programmable number of delay stages in its delay circuit 30, 30' than that shown hereinabove. This would allow for device characterization and testing to select the optimal ETD pulse duration, in which case laser programming or, alternatively, mask programming may be performed to select the desired number of delay stages to effect the desired ETD pulse duration.

Still further in the alternative, multiple summing circuits 20 may also be provided according to the present invention, especially for extremely large integrated circuit chips. Multiple summing circuits may also provided within the integrated circuit, especially when dictated by chip size or by the need for different ETD pulse durations for different operating cycles.

In any event, the present invention provides the important advantages of allowing ETD circuits associated with, and located near, the input terminal pads to present pulses of short duration, thus saving chip area from that required in prior circuits for multiple placements of delay elements. The central summing circuit ensures standardization of ETD pulse durations for transitions from all appropriate input terminals, and also enables the use of a single set of delay stages for multiple input terminals, further improving layout efficiency. The duration of the ETD pulse may also be easily adjusted at the central summing circuit through mask revision, focused ion beam, fuse programming, special test mode operation, and other similar techniques.

While the invention has been described herein relative to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

I claim:

1. A circuit for producing a pulse responsive to a transition at an input, comprising:

a first plurality of transition detection circuits, each associated with one of a first plurality of input terminals, for generating a transition detection pulse having a first duration responsive to a transition at its associated input terminal, each of said first plurality of transition detection circuits having an output at which the transition detection pulse is presented;

a second plurality of transition detection circuits, each associated with one of a second plurality of input terminals, for generating a transition detection pulse having a third duration responsive to a transition at its associated input terminal;

a summing circuit, coupled to each of said plurality of transition detection circuits, for generating a summed transition detection pulse having a second duration substantially longer than the first duration, responsive to receiving a transition detection pulse from one of said plurality of transition detection circuits, comprising:

first logic circuitry having a plurality of inputs, each input coupled to an output of one of said first plurality of transition detection circuits, for presenting a signal at its output responsive to receiving a transition detection signal from one of said first plurality of transition detection circuits;

second logic circuitry having a plurality of inputs, each input coupled to an output of one of said second plurality of transition detection circuits, for presenting a signal at its output responsive to receiving a transition detection signal from one of said second plurality of transition detection circuits;

a delay circuit coupled to the output of said first logic circuitry, for generating at its output a delayed lengthened pulse responsive to the output of said first logic circuitry; and output circuitry, coupled to said first logic circuitry, and to said second logic circuitry, and to said delay circuit, for generating the summed transition detection pulse responsive to either the signal at the output of said first logic circuitry, the signal at the output of said second logic circuitry, or to the delayed lengthened pulse at the output of said delay circuit.

2. A circuit for producing a pulse responsive to a transition at an input, comprising:

a first plurality of transition detection circuits, each associated with one of a first plurality of input terminals, for generating a transition detection pulse having a first duration responsive to a transition at its associated input terminal, each of said first plurality of transition detection circuits having an output at which the transition detection pulse is presented; and a summing circuit, coupled to each of said plurality of transition detection circuits, for generating a summed transition detection pulse having a second duration substantially longer than the first duration, responsive to receiving a transition detection pulse from one of said plurality of transition detection circuits, comprising:

first logic circuitry having a plurality of inputs, each input coupled to an output of one of said first plurality of transition detection circuits, for presenting a signal at its output responsive to receiving a transition detection signal from one of said first plurality of transition detection circuits;

a delay circuit coupled to the output of said first logic circuitry, for generating at its output a delayed lengthened pulse responsive to the output of said first logic circuitry, comprising:

a plurality of delay stages, each having an input and an output, a first one of said plurality of delay stages having its input coupled to the output of said first logic circuitry, and the remainder of said plurality of delay stages having their input coupled to the output of a preceding one of said plurality of delay stages, so that the signal generated by the first logic circuitry propagates through the plurality of delay stages; and a combining circuit, having an input coupled to the output of each of said plurality of delay stages, and having an output coupled to said output circuitry, for generating the delayed lengthened pulse responsive to any one of said delay stages presenting the propagated signal at its output; and output circuitry, .coupled to said first logic circuitry and said delay circuit, for generating the summed transition detection pulse responsive to either the signal at the output of said first logic circuitry or to the delayed lengthened pulse at the output of said delay circuit.

3. A circuit for producing a pulse responsive to a transition at an input, comprising:

a first plurality of transition detection circuits, each associated with one of a first plurality of input terminals, for generating a transition detection pulse having a first duration responsive to a transition at its associated input terminal, each of said first plurality of transition detection circuits having an output at which the transition detection pulse is presented; and a summing circuit, coupled to each of said plurality of transition detection circuits, for generating a summed transition detection pulse having a second duration substantially longer than the first duration, responsive to receiving a transition detection pulse from one of said plurality of transition detection circuits, comprising:

first logic circuitry having a plurality of inputs, each input coupled to an output of one of said first plurality of transition detection circuits, for presenting a signal at its output responsive to receiving a transition detection signal from one of said first plurality of transition detection circuits;

a delay circuit coupled to the output of said first logic circuitry, for generating at its output a delayed lengthened pulse responsive to the output of said first logic circuitry, comprising a series of delay stages, each having first and second inputs, a first one of said series of delay stages having its first and second inputs coupled to the output of the first logic circuitry, each of the remainder of said series of delay stages having its first input coupled to the output of the preceding one of said plurality of delay stages and having its second input coupled to the output of said first logic circuitry; and output circuitry, coupled to said first logic circuitry and to the output of the last of said series of delay stages for generating the summed transition detection pulse responsive to either the signal at the output of said first logic circuitry or to the delayed lengthened pulse at the output of said delay circuit.

4. An integrated circuit, comprising:

a first plurality of input terminals;

a first plurality of transition detection circuits, each associated with one of said first plurality of input terminals, and each for presenting a pulse at an output responsive to a logic transition at its associated input terminal;

a second plurality of input terminals;

a second plurality of transition detection circuits, each associated with one of said second plurality of input terminals, each for generating a pulse responsive to a logic transition at its associated input terminal;

a summing circuit, having a plurality of inputs, each connected to the output of one of said first and second pluralities of transition detection circuits, said summing circuit for presenting, responsive to a pulse at the output of one of said first plurality of transition detection circuits, a summed transition detection pulse having a duration substantially longer than the duration of the pulse at the output of the one of said first plurality of transition detection circuits, said summing circuit comprising:

first logic circuitry having a plurality of inputs, each input coupled to an output of one of said first plurality of transition detection circuits, for presenting a signal at its output responsive to receiving a pulse from one of said first plurality of transition detection circuits;

a delay circuit coupled to the output of said first logic circuitry, for generating at its output a delayed lengthened pulse responsive to the output of said first logic circuitry;

second logic circuitry having a plurality of inputs, each input coupled to an output of one of said second plurality of transition detection circuits, for presenting a signal at its output responsive to receiving a pulse from one of said second plurality of transition detection circuits; and output circuitry, coupled to said first logic circuitry, to said second logic circuitry, and to said delay circuit, for generating the summed transition detection pulse responsive to either the signal at the output of said first logic circuitry, the signal at the output of said second logic circuitry, or the delayed lengthened pulse at the output of said delay circuit.

5. The integrated circuit of claim 4, wherein the first plurality of input terminals are disposed near a plurality of edges of the integrated circuit;

and wherein each of said first plurality of transition detection circuits are located near their associated input terminal.

6. The integrated circuit of claim 4, wherein the summed transition detection signal is used to initiate an operating cycle of the integrated circuit.

7. The integrated circuit of claim 6, wherein the integrated circuit comprises a memory;

and wherein the summed transition detection signal is used to initiate an access of the memory.

8. The integrated circuit of claim 4, wherein the second plurality of input terminals comprise address terminals of the integrated circuit.

9. The integrated circuit of claim 4, wherein said summing circuit comprises:

first logic circuitry having a plurality of inputs, each input coupled to an output of one of said first plurality of transition detection circuits, for presenting a signal at its output responsive to receiving a pulse from one of said first plurality of transition detection circuits;

a delay circuit coupled to the output of said first logic circuitry, for generating at its output a delayed lengthened pulse responsive to the output of said first logic circuitry; and output circuitry, coupled to said first logic circuitry and said delay circuit, for generating the summed transition detection pulse responsive to either the signal at the output of said first logic circuitry or to the delayed lengthened pulse at the output of said delay circuit.

10. The integrated circuit of claim 4, wherein the first plurality of input terminals comprise input data terminals of the integrated circuit.

11. The integrated circuit of claim 4, wherein the second plurality of input terminals comprise address terminals of the integrated circuit.

12. An integrated circuit, comprising:

a first plurality of input data terminals of the integrated circuit;

a first plurality of transition detection circuits, each associated with one of said first plurality of input data terminals, and each for presenting a pulse at an output responsive to a logic transition at its associated input data terminal; and a summing circuit, having a plurality of inputs, each connected to the output of one of said first plurality of transition detection circuits, said summing circuit for presenting, responsive to a pulse at the output of one of said first plurality of transition detection circuits, a summed transition detection pulse having a duration substantially longer than the duration of the pulse at the output of the one of said first plurality of transition detection circuits.

13. An integrated circuit, comprising:

a first plurality of input terminals;

a first plurality of transition detection circuits, each associated with one of said first plurality of input terminals, and each for presenting a pulse at an output responsive to a logic transition at its associated input terminal;

a summing circuit, having a plurality of inputs, each connected to the output of one of said first plurality of transition detection circuits, said summing circuit for presenting, responsive to a pulse at the output of one of said first plurality of transition detection circuits, a summed transition detection pulse having a duration substantially longer than the duration of the pulse at the output of the one of said first plurality of transition detection circuits, said summing circuit comprising:

first logic circuitry having a plurality of inputs, each input coupled to an output of one of said first plurality of transition detection circuits, for presenting a signal at its output responsive to receiving a pulse from one of said first plurality of transition detection circuits;

a delay circuit coupled to the output of said first logic circuitry, for generating at its output a delayed lengthened pulse responsive to the output of said first logic circuitry, comprising:

a plurality of delay stages, each having an input and an output, a first one of said plurality of delay stages having its input coupled to the output of said first logic circuitry, and the remainder of said plurality of delay stages having their input coupled to the output of a preceding one of said plurality of delay stages, so that the signal generated by the first logic circuitry propagates through the plurality of delay stages; and a combining circuit, having an input coupled to the output of each of said plurality of delay stages, and having an output coupled to said output circuitry, for generating the delayed lengthened pulse responsive to any one of said delay stages presenting the propagated signal at its output; and output circuitry, coupled to said first logic circuitry and said delay circuit, for generating the summed transition detection pulse responsive to either the signal at the output of said first logic circuitry or to the delayed lengthened pulse at the output of said delay circuit.

14. An integrated circuit, comprising:

a first plurality of input terminals;

a first plurality of transition detection circuits, each associated with one of said first plurality of input terminals, and each for presenting a pulse at an output responsive to a logic transition at its associated input terminal;

a summing circuit, having a plurality of inputs, each connected to the output of one of said first plurality of transition detection circuits, said summing circuit for presenting, responsive to a pulse at the output of one of said first plurality of transition detection circuits, a summed transition detection pulse having a duration substantially longer than the duration of the pulse at the output of the one of said first plurality of transition detection circuits, said summing circuit comprising:

first logic circuitry having a plurality of inputs, each input coupled to an output of one of said first plurality of transition detection circuits, for presenting a signal at its output responsive to receiving a pulse from one of said first plurality of transition detection circuits;

a delay circuit coupled to the output of said first logic circuitry, for generating at its output a delayed lengthened pulse responsive to the output of said first logic circuitry, comprising a series of delay stages, each having first and second inputs, a first one of said series of delay stages having its first and second inputs coupled to the output of the first logic circuitry, each of the remainder of said series of delay stages having its first input coupled to the output of the preceding one of said plurality of delay stages and having its second input coupled to the output of said first logic circuitry; and output circuitry, coupled to said first logic circuitry and to the output of the last of said series of delay stages for generating the summed transition detection pulse responsive to either the signal at the output of said first logic circuitry or to the delayed lengthened pulse at the output of said delay circuit.

15. A method of initiating an operating cycle of an integrated circuit, comprising:

monitoring a first plurality of input terminals, corresponding to input data terminals, with a first plurality of transition detection circuits;

responsive to one of the first plurality of transition detection circuits detecting a logic transition at one of the first plurality of input terminals, producing a pulse of a first duration;

communicating the pulse of the first duration to a summing circuit that is coupled to each of said first plurality of transition detection circuits; and generating, with the summing circuit and responsive to said communicating step, a transition detection signal having a second duration substantially longer than the first duration.

16. A method of initiating an operating cycle of an integrated circuit, comprising:

monitoring a first plurality of input terminals with a first plurality of transition detection circuits;

responsive to one of the first plurality of transition detection circuits detecting a logic transition at one of the first plurality of input terminals, producing a pulse of a first duration;

communicating the pulse of the first duration to a summing circuit that is coupled to each of said first plurality of transition detection circuits;

generating, with the summing circuit and responsive to said communicating step, a transition detection signal having a second duration substantially longer than the first duration; and monitoring a second plurality of input terminals with a second plurality of transition detection circuits;

responsive to one of said second plurality of transition detection circuits detecting a logic transition at one of said second plurality of input terminals, producing a pulse of a third duration substantially longer than the first duration;

communicating the pulse of the third duration to the summing circuit, the summing circuit being also coupled to each of the second plurality of transition detection circuits; and forwarding the communicated pulse of the third duration as a transition detection signal.

17. The method of claim 16, wherein the first plurality of input terminals correspond to input data terminals;

and wherein the second plurality of input terminals correspond to address terminals.

18. The method of claim 16, wherein the integrated circuit comprises a memory.

* * * * *